United States Patent [19]
Hetzler

[11] Patent Number: 5,369,535
[45] Date of Patent: Nov. 29, 1994

[54] FIXED BLOCK ARCHITECTURE DISK FILE WITH IMPROVED POSITION IDENTIFICATION AND ERROR HANDLING

[75] Inventor: Steven R. Hetzler, Sunnyvale, Calif.

[73] Assignee: International Business Machines Corporation, Armonk, N.Y.

[21] Appl. No.: 858,390

[22] Filed: Mar. 25, 1992

[51] Int. Cl.$^5$ .............................................. G11B 5/596
[52] U.S. Cl. .............................. 360/78.14; 360/78.08; 360/77.08; 360/77.11
[58] Field of Search ...................... 360/53, 135, 77.02, 360/77.08, 77.11, 77.01, 77.04, 78.08, 78.04, 78.14

[56] References Cited

U.S. PATENT DOCUMENTS

| | | |
|---|---|---|
| 4,575,775 | 3/1986 | Albrecht . |
| 4,656,538 | 4/1987 | Mattson ............................ 360/77.08 |
| 4,669,004 | 5/1987 | Moon et al. . |
| 4,977,470 | 12/1990 | Murayama et al. ................ 360/77.08 |
| 4,984,100 | 1/1991 | Takayama et al. ................. 360/78.14 |
| 5,027,234 | 6/1991 | Kawahara ........................ 360/77.08 |
| 5,164,866 | 11/1992 | Sano et al. ........................ 360/77.08 |

FOREIGN PATENT DOCUMENTS

| | | | |
|---|---|---|---|
| 0069549 | 1/1983 | European Pat. Off. ..... | G11B 21/10 |
| 0106661 | 4/1984 | European Pat. Off. ..... | G11B 5/016 |

OTHER PUBLICATIONS

"Digital Correction For Disk File Errors", IBM Technical Disclosure Bulletin, vol. 32, No. 8B, Jan. 1990, pp. 92–93.

"Magnetfolienspeicher", H. Klotzner, Radio Fernsehen Elektronik, vol. 32, No. 11, Nov. 1983, pp. 717–720.

"Serializing FIFOs And Burst Error Processor Team Up To Enhance Serial Data Reliability", S. Rajpal, et al., IRE WESCON Convention Record, vol. 27, 1983, pp. 1–8.

"Hybrid Position Error Signal Generation For Disk File", W. J. P. Case & B. Fraser, IBM Technical Disclosure Bulletin, vol. 25, No. 6, Nov. 1982 pp. 2910–2914.

Primary Examiner—Richard A. Bertsch
Assistant Examiner—Charles G. Freay
Attorney, Agent, or Firm—David J. Kappos; Thomas R. Berthold

[57] ABSTRACT

A data recording disk file is provided with fixed block address head positioning information that is readable off-track with no increase in error rate. The positioning information includes both identification information to provide radial and/or circumferential orientation for the recording head, and error handling information to ensure that the id information is properly read. Either or both of the id information and the error handling information for adjacent tracks are placed on the data storage disk at circumferentially offset positions to eliminate adjacent track interference, and at radially overlapped positions extending into the adjacent tracks to provide full readability when the head is off-track.

15 Claims, 3 Drawing Sheets

SECTOR SERVO HEAD POSITIONING INFORMATION HAVING OFFSET ID FIELDS AND OFFSET EH FIELDS.

SECTOR SERVO HEAD POSITIONING INFORMATION

SECTOR SERVO HEAD POSITIONING INFORMATION WITH ERROR HANDLING

DATA RECORDING DISK FILE

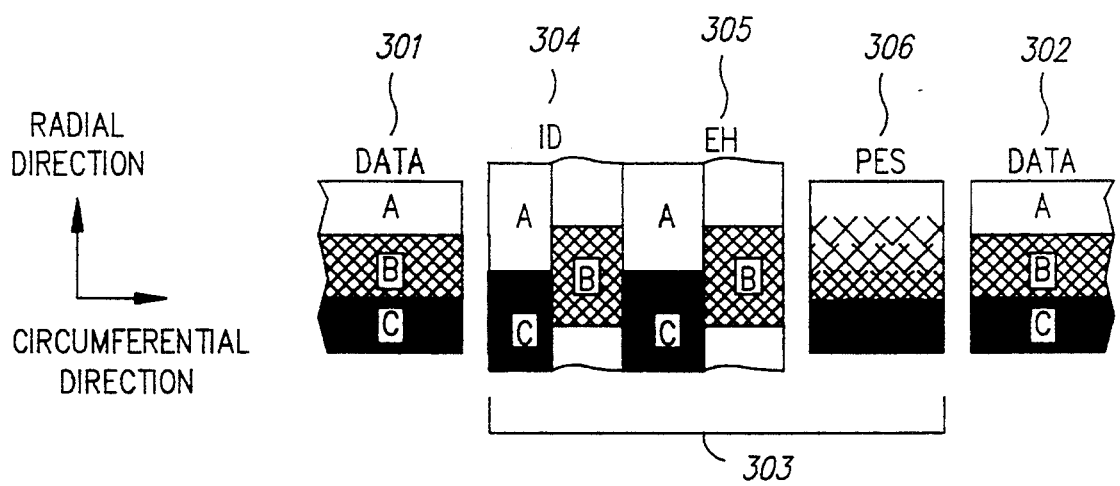
FIG. 3  SECTOR SERVO HEAD POSITIONING INFORMATION HAVING OFFSET ID FIELDS AND OFFSET EH FIELDS.
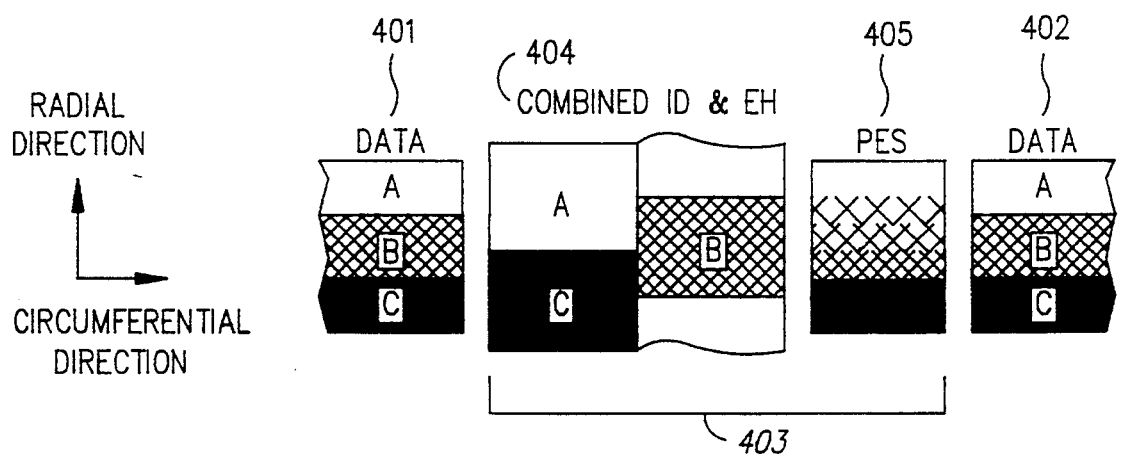
FIG. 4  SECTOR SERVO HEAD POSITIONING INFORMATION HAVING OFFSET COMBINED ID/EH FIELDS.
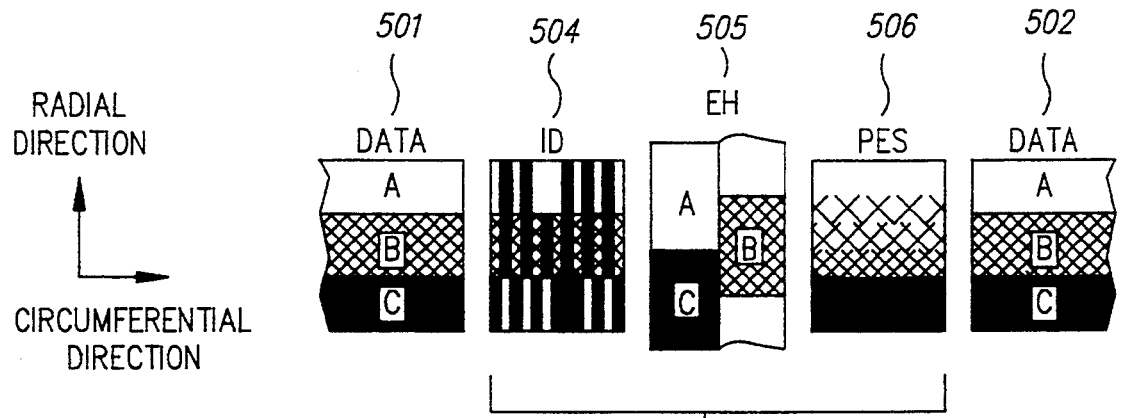
FIG. 5  SECTOR SERVO HEAD POSITIONING INFORMATION USING GRAY CODE AND OFFSET EH FIELDS.

FIXED BLOCK ARCHITECTURE DISK FILE WITH IMPROVED POSITION IDENTIFICATION AND ERROR HANDLING

This invention relates in general to data recording disk files, and in particular to fixed block architecture disk files with head positioning information recorded on multiple track data storage disks.

BACKGROUND OF THE INVENTION

All disk files require some means of determining the radial position of the read and write transducers (or heads) heads over the disks so that the heads can be accurately positioned over any desired track. Typically this is accomplished by recording head positioning information on one or more of the disk surfaces for reading by magnetic or optical heads. Some disk files, known as dedicated servo files, contain positioning information only on a dedicated surface of one disk in the disk stack. In contrast, some modern files, known as sector servo files, store the positioning information interspersed with the data on each disk surface. This latter approach represents the direction in which the technology is progressing and is preferred because it can be implemented at low cost and without additional componentry beyond that required to store the data and further because it provides the positioning information at the data surface being accessed, thereby eliminating many mechanical and thermal sources of track misregistration. Fixed block architecture (FBA) is a common configuration used to format both dedicated servo disk files and sector servo disk files. In an FBA formatted disk file, each disk track is divided into a number of equal-sized sectors, and each sector is divided into regions containing either positioning information or data.

A portion of a typical FBA sector servo sector is illustrated in FIG. 1A. The portion shown spans the end of one sector and the start of another, and shows in particular the positioning information provided between sectors for three adjacent tracks—A, B and C. 101 shows the end of data regions for tracks A, B and C. 102 shows the start of the succeeding data regions for tracks A, B and C. In between is head positioning information for each track designated generally by 103 and including position identification (position-ID) field 104 and position error indicating (PES) field 106. Position-ID field 104 typically includes a track number and/or a sector number to provide radial (track) and/or circumferential (sector) orientation for the recording head. It may be encoded in a gray format, in which the encoded numbers on adjacent tracks differ by only one bit. This allows the track/sector id to be known to $\pm 1$ tracks, even when inbetween tracks. PES field 106 provides a fine positioning signal used by the disk file to position the recording head precisely over the center of a given track.

In a dedicated servo disk file, the positioning information is encoded on a separate surface from the data surfaces. The positioning information is encoded in a manner similar to that described above with reference to sector servo disk files, and is similar in form to positioning information 103.

While the position-ID field provided by the prior art is designed to be accurately readable when the recording head is on-track, there are circumstances in which it is desirable to accurately read the position-ID information when the head may not be positioned on-track. Such circumstances may arise during a settle operation following a track access when the head has not yet settled over the desired track but it is nevertheless desired to read the position-ID field, or where the servo architecture depends on the servo system to precisely identify the sector number. Such circumstances may also arise in magneto-resistive (MR) head designs where one element is used for writing and another for reading. Misalignment between the read and write elements can occur due to production constraints (inability to precisely align the elements at manufacture time) and due to design constraints (inter-element shift as a function of accurate direction of access in rotary actuator systems).

The effects of misalignment can be alleviated by a technique known as micro-jog, which involves adjustment of the head-track position between reading and writing to allow the appropriate head element to be on-track for a given operation. However, for a write operation a micro-jog itself may move the read element significantly off-track.

In the above mentioned circumstances in which it is desirable to read positioning information when the head is off-track, the prior art position-ID field described above suffers increased error rate (percentage of READ operations that fail to detect the sought-after information) due to interference from the adjacent track and decreasing signal-to-noise ratios. This problem is somewhat correctable by encoding the position-ID field in gray code so that the position-ID can be known to within a value of $\pm 1$. However, when the head is off-track, the position where the single changing bit changes from a 0 to a 1 is not well defined. Also, the position-ID information is still susceptible to errors when read, so in cases where the position-ID must be known exactly, gray coding may prove ineffective. Moreover, the use of gray coding increases the length of the position-ID field. The values 0 and 1 must be recorded using the same number of magnetic transitions to preserve the magnetization state, effectively doubling the length.

FIG. 1B. shows a possible means for adding error handling information to the head positioning information. An error handling (EH) field 105' is appended to the position-ID field 104'. This field may be encoded in a number of ways, including a cyclic redundancy check (CRC), error checking and correction code (ECC), parity, or redundant encoding (writing one or more extra copies of the field). However, EH field 105', which is provided as an accuracy check against position-ID field 104', cannot be encoded as a gray code. If the ECC bits are merely appended to the gray code, as shown, they will also suffer an increased error rate when read off-track.

Thus, there presently exists an unmet need for a method and means which allows the positioning information to be accurately read off-track with no increase in error rate.

OBJECTS OF THE INVENTION

It is therefore an object of the present invention to provide a data recording disk file having head positioning information including an error handling field that can be read off-track with no impact on error rate.

It is another object of the present invention to provide a data recording disk file having head positioning information including a position identification field that can be read off-track with no impact on error rate.

It is another object of the present invention to provide a data storage disk having head positioning information wherein error handling fields associated with adjacent tracks are located at nonoverlapping circumferential positions and overlapping radial positions.

It is another object of the present invention to provide a data storage disk having head positioning information wherein position identification fields associated with adjacent tracks are located at nonoverlapping circumferential positions and overlapping radial positions.

These and other object will become more apparent when read in light of the following specification and drawings.

SUMMARY OF THE INVENTION

In accordance with the invention, a data recording disk file is provided with FBA head positioning information that is readable off-track with no increase in error rate. The positioning information on each track includes both position identification and error handling fields, in addition to a position error indicating field. The position identification field may include a track identification number and a sector identification number to provide radial and circumferential orientation for the recording head. The error handling field ensures that the position identification field is properly read, and may be encoded as ECC, CRC, parity, or redundant encoding. The position identification and error handling fields for adjacent tracks are placed on the data storage disk at circumferentially offset positions to eliminate adjacent-track interference, and at radially overlapped positions extending into the adjacent tracks to provide full readability when the head is off-track. In the preferred embodiment, the position identification field and error handling field are separate, circumferentially adjacent fields, both of which are placed at circumferentially offset positions and radially overlapped positions with respect to like fields on adjacent tracks. In one alternative embodiment, the position identification and error handling fields are combined into a single field, which is itself placed at circumferentially offset positions and radially overlapped positions on adjacent tracks. In another alternative embodiment, the position identification field is encoded in gray code without any offset or overlap, while the error handling field is a separate field which is placed at circumferentially offset positions and radially overlapped positions on adjacent tracks.

BRIEF DESCRIPTION OF THE DRAWINGS

FIG. 3 is a schematic diagram illustrating fixed block architecture sector servo head positioning information having offset ID fields and offset EH fields.

FIG. 4 is a schematic diagram illustrating fixed block architecture sector servo head positioning information having offset combined ID/EH fields.

FIG. 5 is a schematic diagram illustrating fixed block architecture sector servo head positioning information using gray code and offset EH fields.

DETAILED DESCRIPTION OF THE INVENTION

Figure 1A:
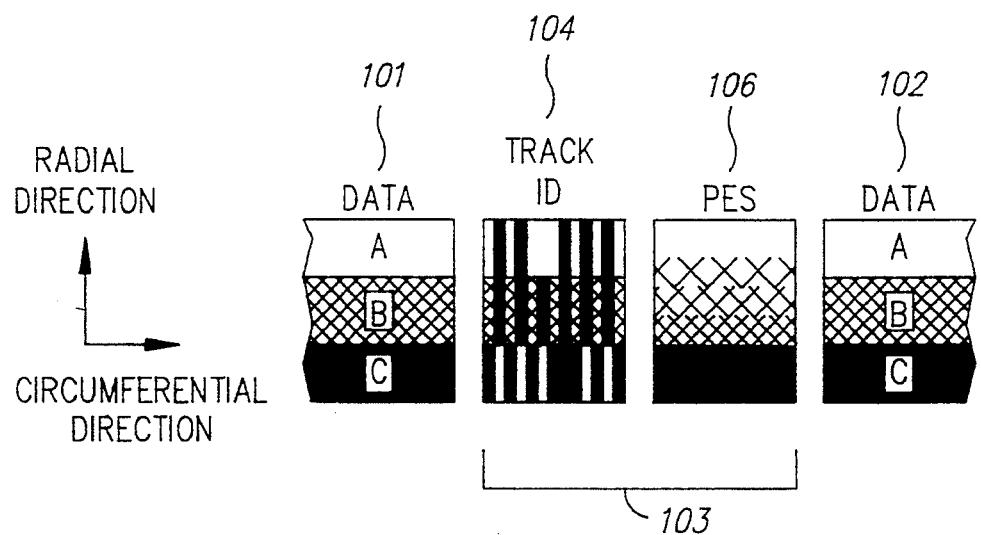
FIG. 1A is a schematic diagram illustrating fixed block architecture sector servo head positioning information according to the prior art.
Figure 1B:
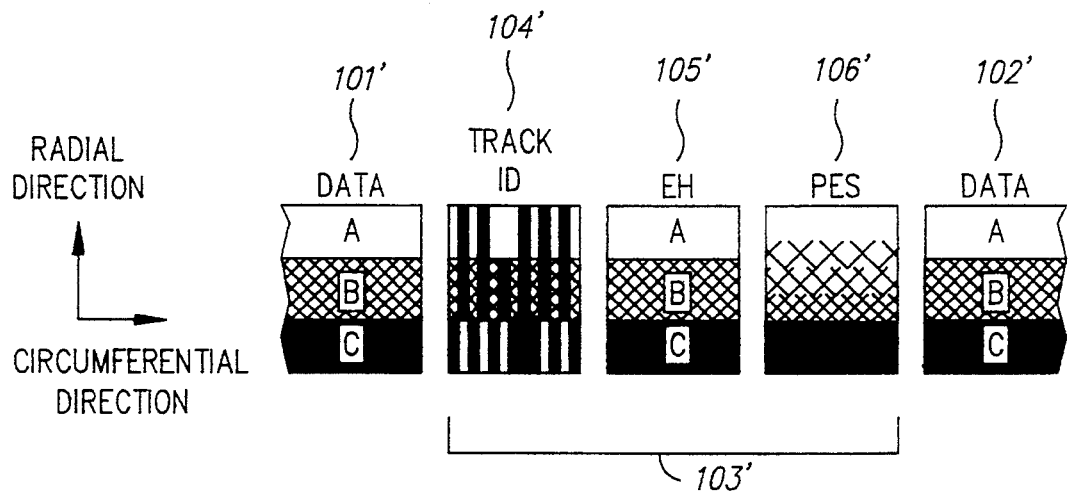
FIG. 1B is a schematic diagram illustrating fixed block architecture sector servo head positioning information with error handling according to the prior art.
Figure 2:
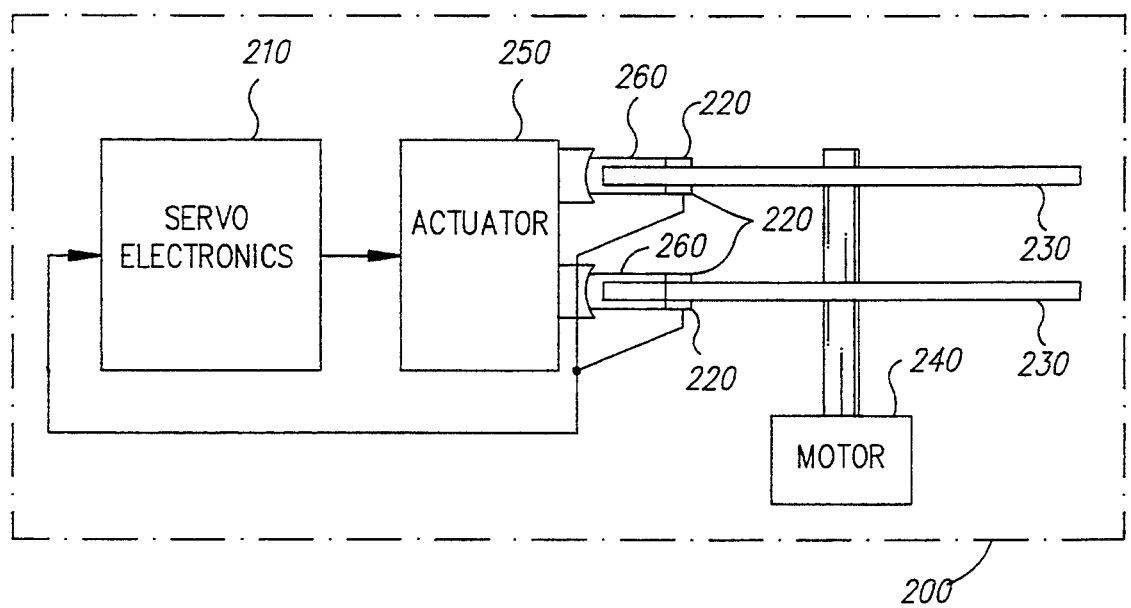
FIG. 2 is a block diagram illustrating a data recording disk file including head positioning information according to the present invention.

Shown in FIG. 2 is a block diagram of a data recording disk file 200 including head positioning information according to the present invention. Disk file 200 includes servo control means 210, data recording heads 220, rotatable data storage disks 230, motor 240, actuator 250, and actuator arms 260. In operation, servo control means 210 receives the head positioning information of the present invention from heads 220 and provides actuator control through actuator 250, which effects movement of actuator arms 260. Meanwhile, spindle motor 240 rotates disks 230 past heads 220 at a constant angular rate.

FIG. 3 illustrates a close-up view of a multiple track data storage disk according to the preferred embodiment of the present invention. The disk is organized by tracks and sectors, where tracks are concentric rings, each at a given radius on the disk and extending circumferentially around the disk, and sectors are subdivisions of individual tracks which are radially aligned to form wedges on the disk. The portion of the disk shown spans the end of one sector and the start of another, and shows in particular the head positioning information provided between sectors for three adjacent tracks—A, B and C. 301 shows the end of data regions for tracks A, B and C. 302 shows the start of the succeeding data regions for tracks A, B and C. In between is head positioning information designated generally by 303 and including position identification (position-ID) fields 304 for each track, error handling (EH) fields 305 for each track, and position error indicating (PES) fields 306 for each track. The position-ID fields 304 provide radial (track) and optionally circumferential (sector) orientation for the recording head. The EH fields 305 provide a check on the position-ID fields, ensuring that they are read with no errors. The PES fields 306 provide fine positioning signals used by the disk file to position the recording head precisely over the center of a given track.

Position-ID fields 304 for adjacent tracks are recorded at format-time circumferentially offset from one another at alternating distances from the end of data regions 301 such that the position-ID fields for adjacent tracks do not overlap in the circumferential direction. Thus, when the position-ID field is read off-track, it will not be subject to reading the adjacent track information. In addition to being circumferentially offset, position-ID fields 304 extend radially into the adjacent tracks so that adjacent-track position-ID fields occupy overlapping radial positions. This allows the position-ID fields to be read off-track with no increase in the error rate. It is to be noted that the position-ID field may contain any form of information which provides orientation assistance to the head; in the preferred embodiment, a track number and an index mark are encoded there, enabling the disk file to determine the relative position of the head and disk in both the radial and circumferential directions. The index mark is used to identify one of the sectors as number 0; the other sectors are identified in sequential order around the track with respect to sector 0. However, the position-ID field may also contain a sector number and any other information relating to the servo or data systems, or for that matter any information at all for which off-track readability is desired.

Like position-ID fields 304, adjacent EH fields 305 according to the preferred embodiment of the present invention are recorded at nonoverlapping circumferential positions and overlapping radial positions. They receive the same benefits from this positioning as do the position-ID fields—immunity from adjacent track interference and readability off-track with no increase in the error rate. With respect to EH fields 305, it is to be noted that they may be encoded with any form of information which provides error detection or error correction, including error checking and correction (ECC) or cyclic redundancy check (CRC), either of which may be used according to the preferred embodiment. Or, EH fields 305 may be encoded with alternative forms of error detection/correction information such as parity or redundant encoding.

Both position-ID fields 304 and EH fields 305 may be recorded such that fields representing adjacent tracks are circumferentially spaced apart from one another, creating gaps between them. However, according to the preferred embodiment adjacent track fields are recorded circumferentially abutting one another such that the end of the first field and the start of the second field are approximately on the same radial line. This minimizes the disk space occupied by the head positioning information. More importantly, this improves readability during high speed seeks, when the radial velocity of the head may be quite high. In such cases, having the position-ID fields for adjacent tracks as close together as possible ensures that one of the two adjacent position-IDs will be read. The EH fields are then used during settle and track follow operations.

Additionally, both position-ID fields 304 and EH fields 305 may be recorded extending only slightly into adjacent tracks in order to exclude interference from the next-to-adjacent track. However, according to the preferred embodiment, fields 305 extend 50% into both adjacent tracks in order to provide full readability with the read head up to 50% off-track.

FIG. 4 illustrates a close-up view of a multiple track data storage disk according to an alternative embodiment of the present invention. The track/sector organization of the disk is generally the same as in the preferred embodiment. In particular, 401 shows the end of data regions for adjacent tracks A, B and C; 402 shows the start of the succeeding data regions. In between is head positioning information designated generally by 403, and including combined position-ID and EH fields 404 for each track and PES fields 405 for each track.

PES fields 405 perform the same function as PES fields 306 in the preferred embodiment. Combined position-ID and EH fields 404 are formed by encoding the position identification and error handling information together. Adjacent fields 404 are recorded at nonoverlapping circumferential positions and overlapping radial positions to gain the same advantages as in the preferred embodiment—elimination of adjacent track interference and off-track readability of position-ID and EH information. The resulting configuration is useful in applications where it is desired to reduce the number of head positioning information fields or where the EH field is short or where the combined fields are short enough that one of the two adjacent position-ID and EH fields will be readable at maximum seek velocity. These latter two qualifications obtain because the increased overall length of fields 404 can result in those fields becoming unreadable in cases where the head is moving across tracks so quickly that it cannot read an entire combined position-ID and EH field in the time period it is over a given track.

FIG. 5 illustrates a close-up view of a multiple track data storage disk according to another alternative embodiment of the present invention. The track/sector organization of the disk is generally the same as in the preferred embodiment. In particular, 501 shows the end of data regions for adjacent tracks A, B and C; 502 shows the start of succeeding data regions. In between is head positioning information designated generally by 503, and including position-ID fields 504 for each track, EH fields 505 for each track, and PES fields 506 for each track. All fields perform the same basic functions as their counterparts in the preferred embodiment. Adjacent EH fields 505 are recorded at nonoverlapping circumferential positions and overlapping radial positions to gain the same advantages as in the preferred embodiment—elimination of adjacent track interference and off-track readability of EH information. Position-ID fields 504 are recorded side-by-side in gray code to provide position-ID readability to within one track when the head is off-track. This implementation does not have the advantages of the preferred embodiment with respect to the position-ID field, but may nevertheless be useful in applications where it is desired to encode the position-ID field in a gray code format.

While the invention has been particularly described and illustrated with reference to a preferred embodiment and alternative embodiments, it will be understood by those skilled in the art that additional changes in the description or illustrations may be made with respect to form or detail without departing from the spirit and scope of the invention.

What is claimed is:

1. A data recording disk file comprising:
   a rotatable data storage disk, including
   a first track having a plurality of first data regions, a plurality of first position identification fields, and a plurality of first error handling fields for handling errors in said first position identification fields,
   a second track, positioned radially adjacent to said first track, having a plurality of second data regions, a plurality of second position identification fields, and a plurality of second error handling fields for handling errors in said second position identification fields,
   wherein said first position identification fields and said second position identification fields are located at nonoverlapping circumferential positions and overlapping radial positions, and said first error handling fields and said second error handling fields are located at nonoverlapping circumferential positions and overlapping radial positions;
   a motor for rotating said data storage disk;
   an actuator arm positionable over said data storage disk;
   an actuator for positioning said actuator arm over said data storage disk;
   a data recording head attached to said actuator arm, for reading or writing data on said data storage disk; and
   servo control means, coupled to said data recording head and said actuator for receiving head positioning information from said recording head and providing actuator control.

2. A data recording disk file as recited in claim 1 wherein said first and second position identification fields include any of a track number and an index mark.

3. A data recording disk file as recited in claim 2, wherein said first and second error handling fields include error checking and correction information.

4. A data recording disk file as recited in claim 1 wherein said first and second error handling fields include parity information.

5. A data recording disk file as recited in claim 1 wherein the actuator is a rotary actuator and wherein the data recording head includes separate read and write elements.

6. A data recording disk file as recited in claim 1 wherein the data recording head includes separate read and write elements and wherein the read element attached to the actuator arm is misaligned relative to the write element attached to the actuator arm.

7. A data recording disk file as recited in claim 1 wherein the position identification and error handling fields of said first track radially overlap into approximate half the width of said second track.

8. A method for formatting a multiple track data storage disk, comprising the steps of:
positioning a recording head over a first track;
recording on said first track a plurality of first position identification fields and a plurality of first error handling fields for handling errors in said first position identification fields;
positioning said recording head over a second track, wherein said second track is radially adjacent to said first track; and
recording on said second track a plurality of second position identification fields and a plurality of second error handling fields for handling errors in said second position identification fields, said second position identification fields being recorded with respect to said first position identification fields at nonoverlapping circumferential positions and overlapping radial positions, and said second error handling fields being recorded with respect to said first error handling fields at nonoverlapping circumferential positions and overlapping radial positions.

9. A data recording disk file comprising:
a rotatable data storage disk, including
a first track having a plurality of first data regions, a plurality of first position identification fields encoded in gray code, and a plurality of first error handling fields for handling error in said first position identification fields,
a second track, positioned radially adjacent to said first track, having a plurality of second data regions, a plurality of second position identification fields encoded in gray code, and a plurality of second error handling fields for handling errors in said second position identification fields, and
wherein said first error handling fields and said second error handling fields are located at nonoverlapping circumferential positions and overlapping radial positions;
a motor for rotating said data storage disk;
an actuator arm positionable over said data storage disk;
an actuator for positioning said actuator arm over said data storage disk;
a data recording head attached to said actuator arm, for reading or writing data on said data storage disk; and
servo control means, coupled to said data recording head and said actuator for receiving head positioning information from said recording head and providing actuator control.

10. A data recording disk file as recited in claim 9 wherein the actuator is a rotary actuator and wherein the data recording head includes separate read and write elements.

11. A data recording disk file as recited in claim 9 wherein the data recording head includes separate read and write elements and wherein the read element attached to the actuator arm is misaligned relative to the write element attached to the actuator arm.

12. A data recording disk file comprising:
a rotatable data recording disk having a plurality of concentric tracks with position identification fields, the position identification fields of a first one of the tracks extending into radially adjacent tracks and being circumferentially spaced from the position identification fields of the radially adjacent tracks, and the position identification fields of the tracks radially adjacent to said first track extending into said first track;
a motor for rotating the disk;
a read element for reading data from the tracks on the disk;
a separate write element for writing data to the tracks on the disk;
a rotary actuator connected to the read and write elements for positioning the write element to write on said first track while the read element is radially aligned with position identification fields and their extensions into a radially adjacent track; and
servo control circuitry coupled between the read element and the actuator for controlling movement of the actuator in response to positioning information read from the disk by the read element.

13. A data recording disk file as recited in claim 12 wherein the read element connected to the actuator is radially misaligned relative to the write element connected to the actuator.

14. A data recording disk file as recited in claim 12 wherein the disk is a magnetic recording disk and the read element is a magnetoresistive read element.

15. A data recording disk file as recited in claim 12 wherein the position identification field of said first track extends into approximately half the track width of its radially adjacent tracks.

* * * * *